United States Patent [19]

Gudow

[11] Patent Number: 4,865,494
[45] Date of Patent: Sep. 12, 1989

[54] NUMERICALLY CONTROLLED MACHINE FOR PROCESSING PRINTED CIRCUIT BOARDS

[75] Inventor: Karlheinz Gudow, Bad Homburg, Fed. Rep. of Germany

[73] Assignee: Klingelnberg Söhne, Remscheid, Fed. Rep. of Germany

[21] Appl. No.: 204,570

[22] Filed: Jun. 9, 1988

[30] Foreign Application Priority Data

Jun. 9, 1987 [DE] Fed. Rep. of Germany ....... 3719167

[51] Int. Cl.$^4$ ............................................. B23B 39/08
[52] U.S. Cl. .................... 408/13; 364/474.17; 364/474.28; 408/11; 408/14; 408/95
[58] Field of Search ............... 408/1 R, 3, 8, 10–14, 408/16, 95, 98; 409/218; 364/474.11, 474.15, 474.17, 474.18, 474.28, 474.34, 474.35, 474.37

[56] References Cited

U.S. PATENT DOCUMENTS

| | | | |
|---|---|---|---|
| 3,481,247 | 12/1969 | Hayes | 409/218 |
| 3,614,909 | 10/1971 | Neuser | 409/218 |
| 3,636,814 | 1/1972 | Esch | 409/218 X |
| 4,326,824 | 4/1982 | Lasermann et al. | 408/13 X |
| 4,520,551 | 6/1985 | Imof | 29/568 |
| 4,658,494 | 4/1987 | Ohtani et al. | 408/3 X |
| 4,669,927 | 6/1987 | Zeller | 408/11 X |
| 4,765,784 | 8/1988 | Karwan | 408/13 |

*Primary Examiner*—Steven C. Bishop
*Attorney, Agent, or Firm*—Becker & Becker, Inc.

[57] ABSTRACT

A numerically controlled machine for processing printed circuit boards, including a workpiece holder and at least one operating unit that includes a motor arbor with an exchangeable tool, and a feed mechanism with a drive motor, a control mechanism, and a first movement-measuring system. For each operating unit, there is provided a respective second movement-measuring system that is disposed thereon, and a respective reference measuring point on the workpiece holder, with the aid of which there can be measured a distance between a tip of the tool and an abutment surface of the operating unit that rests upon a workpiece during a processing operation. Prescribed drilling depths are correctable in the control mechanism of the feed mechanism via the measured distance value. This compensation of respective tolerance values is effected independently for each operating unit.

3 Claims, 3 Drawing Sheets

NUMERICALLY CONTROLLED MACHINE FOR PROCESSING PRINTED CIRCUIT BOARDS

BACKGROUND OF THE INVENTION

The present invention relates to a numerically controlled machine for processing printed circuit boards, with the machine including a workpiece holder and at least one work or operating unit that comprises a motor arbor with an exchangeable tool, and a feed mechanism with a drive motor, a control mechanism, and a movement-measuring system.

With such machines, printed circuit boards for printed circuits are processed, especially for the production of bores or holes (both throughbores and blind holes). For this purpose, the workpiece holder, upon which the printed circuit boards are secured, and the operating unit are positioned relative to one another in two coordinate directions. During the subsequent processing operation, the feed mechanism moves the arbor, along with the tool that it accommodates, in the third coordinate direction to the drilling depth. Generally, several operating units are present on a single machine in order to be able to simultaneously process several printed circuit boards or printed circuit board packets. So that for each printed circuit board different operations and holes with different diameters can be carried out, devices for automatic exchange of tools are provided, such as disclosed in German Pat. No. 33 01 036 Imhof dated Aug. 14, 1986 and corresponding to U.S. Pat. No. 4,520,551 -Imhof dated June 4, 1985.

With the heretofore known machines, the drilling depth results from the amount of feed of the motor arbor, with this amount of feed being measured by the movement-measuring system from a one-time adjusted stop or some other reference point. Due to the unavoidable tolerances in the length of the various tools, in the thickness and waviness of the printed circuit boards, and in the accuracy of the guidance between the workpiece holder and the respective operating unit, the holes cannot exactly achieve the prescribed depth. This is particularly disadvantageous when multi-layer boards are to be provided with blind holes, the depth of which, as measured from the upper surface of the boards, must be precise to within a few microns.

It is therefore an object of the present invention to improve a processing machine of the aforementioned general type in such a way that the prescribed drilling depths can be achieved within narrow tolerances in a highly reproducible manner.

BRIEF DESCRIPTION OF THE DRAWINGS

This object, and other objects and advantages of the present invention, will appear more clearly from the following specification in conjunction with the accompanying schematic drawings, in which.

SUMMARY OF THE INVENTION

The machine of the present invention is characterized primarily in that for each operating unit, there is provided a respective further movement-measuring system that is disposed thereon, and a respective reference measuring point on the workpiece holder, with the aid of which there can be measured a distance between a tip of the tool and an abutment surface of the operating unit that rests upon a workpiece during a processing operation, with the prescribed drilling depths being correctable in the control mechanism of the feed mechanism via the measured distance value.

The effect of the inventive feature is that the control mechanism separately recognizes for each operating unit when, during each individual drilling process, the tip of the tool has just contacted the surface of the printed circuit board. From this position, the prescribed drilling depth is then achieved.

Further specific features of the present invention will be described in detail subsequently.

DESCRIPTIONS OF PREFERRED EMBODIMENTS

Figure 1:
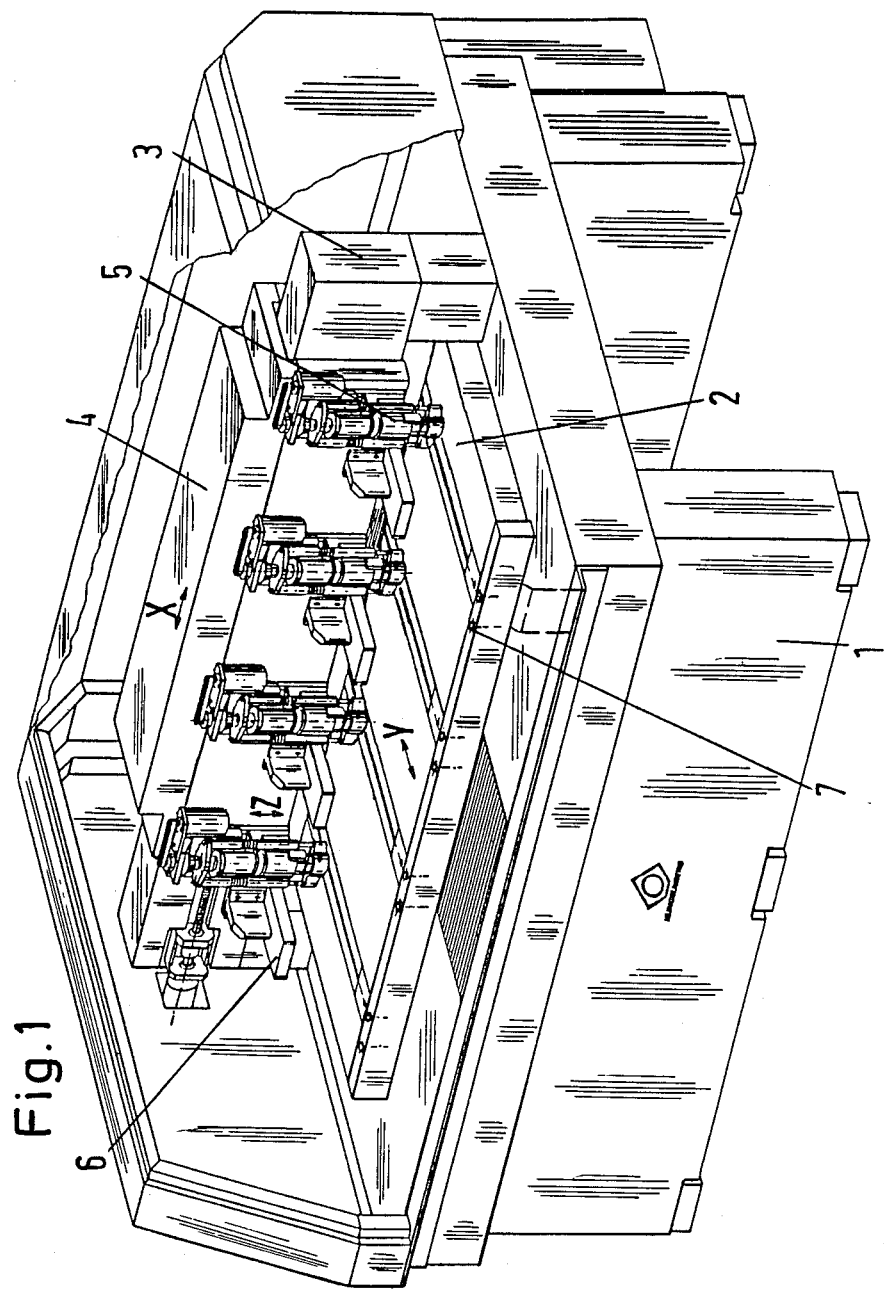
FIG. 1 is a perspective view of one exemplary embodiment of the inventive numerically controlled machine for processing printed circuit boards, with this machine having four operating units.

Referring now to the drawings in detail, the machine illustrated in FIG. 1 comprises a table 1, upon which the workpiece holder 2 can be moved in a first coordinate direction (Y), and a gantry 3, on which a carriage 4 having four work or operating units 5 can be moved in the second coordinate direction (X) transverse to the direction of travel of the workpiece holder 2. In addition, a respective tool magazine 6 is disposed on the carriage 4 for each operating unit 5; in conjunction with known auxiliary devices, these tool magazines 6 enable automatic exchange or replacement of the tools. Disposed on the workpiece holder 2 are respective reference measuring of control points 7 that can be encountered by the pertaining operating unit 5. The number of such operating units can vary, and can, for example, be as high as ten.

Figure 2:
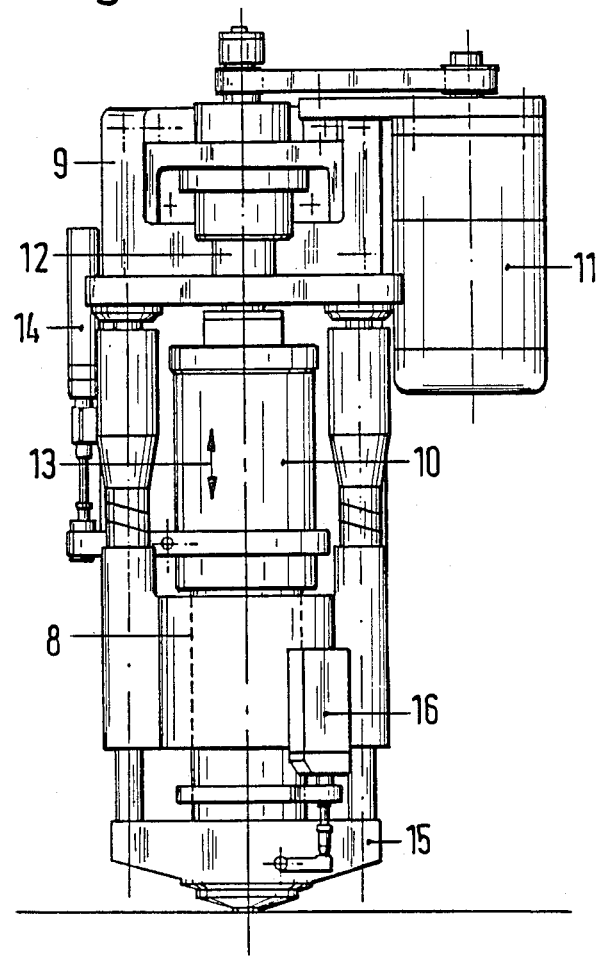
FIG. 2 is an enlarged view of one of the working units.

As shown in FIG. 2, each operating unit is provided with a longitudinal guide means 8 on a support frame 9 that is secured to the carriage 4. A motor spindle or arbor 10 can be shifted in the longitudinal guide means 8, in the direction of the arrow 13, with the aid of the drive motor 11 and a ball-type rotary spindle or (anti-friction) ball screw 12. The amount by which the arbor 10 shifts is measured by a first movement-measuring system 14, and this measurement is fed to a known control mechanism. Also disposed on the longitudinal guide means 8 is a pneumatic device 15 for holding down a workpiece. The movement or shifting of the device 15 relative to the arbor 10 can be measured by a second movement-measuring system 16. Though not shown in detail, the arbor 10 is provided with an automatic chuck for receiving and exchanging tools.

Figure 3:
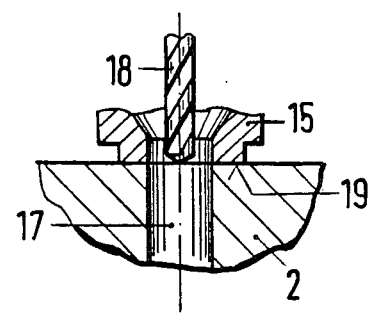
FIG. 3 is an enlarged cross-sectional view through the reference measuring point.

FIG. 3 shows the presently preferred embodiment for the reference measuring point 7. The latter comprises a switch element 17, the switch point of which is flush with the upper surface of the workpiece holder 2. To effect a measurement, the operating unit 5, with a newly received tool 18, moves over the switch. The reference or abutment surface 19 of the device 15 for holding down a workpiece is placed upon the upper surface of the workpiece holder 2, and the tool 18, which is not running, is lowered onto the switch element 17. The switch point of the second movement-measuring system 16 reads off the distance that the tip of the actual tool 18 has from the abutment surface 19 in the starting position; this distance is stored in the control mechanism.

The drilling of blind holes having a precisely maintained depth is now carried out as follows:

The motor arbor 10 is turned on so that it rotates, is positioned over the printed circuit board, and is lowered with the feeding unit. At the same time, the device 15 for holding down a workpiece descends and presses the printed circuit board upon the workpiece holder 2. The arbor 10 is now shifted further by the feeding mechanism in dead movement, and the distance read off at the second movement-measuring system 16 between the arbor 10 and the hold-down device 15 is constantly compared with the stored value. If these values are identical, the tip of the actual tool has reached the same position relative to the contact surface of the hold-down device 15 as at the reference measuring point, in other words precisely the upper surface of the printed circuit board, regardless of how flat the printed circuit board rests upon the workpiece holder, how thick the drilling location of the printed circuit board is, or what distance has been covered in the dead movement. The control mechanism now switches to the working stroke, which is measured by the first movement-measuring system 14 and is carried out until the prescribed drilling depth is achieved.

All of the immediately following drilling operations of an operating unit with the same tool utilize the same distance value that is stored in the control mechanism in order to find the correct starting position for the respective working stroke. Only after the next tool exchange is it necessary to determine at the reference measuring point 7 the new distance value of the tip of the tool, and to store this value in the control mechanism.

The described method of operation is effected independently for each operating unit. Thus, the control mechanism separately stores as many distance values from the respective reference measuring points 7 as there are operating units 5, and the control mechanism monitors the operating sequence in such a way that an operating stage must first be concluded by all of the units before the next stage is initiated in common.

Pursuant to a further embodiment of the machine of the present invention, some of the functions of the second movement-measuring system 16 can be taken over by the first movement-measuring system 14. The second movement-measurement system 16 then comprises, for example, only a microswitch that effects a parallel reading and storing of the distance values at the first movement-measuring system 14. As a result, the basic operation that is made possible by the inventive features is not changed. The same is true if the switch element 17 at the reference measuring point 7, and the movement-measuring system 16 on the operating unit, are interchanged.

The present invention is, of course, in no way restricted to the specific disclosure of the specification and drawings, but also encompasses any modifications within the scope of the appended claims.

I claim:

1. A numerically controlled machine for processing printed circuit boards having unavoidable tolerances in thickness and waviness thereof, including a workpiece holder and at least one operating unit, which comprises a motor arbor with an exchangeable tool having unavoidable tolerances in a length thereof, and a feed mechanism with a drive motor, a control mechanism, and a first movement-measuring system, said machine further comprising:

for each operating unit, a respective second movement-measuring system that is disposed thereon, and, associated therewith, a respective reference measuring point on said workpiece holder, with the aid of which there can be accurately measured a distance between a tip of said tool and a reference location which is an abutment surface, of said operating unit, that rests upon an actual workpiece surface during a processing operation, with prescribed drilling depths being correctable in said control mechanism of said feed mechanism via said measured distance value irrespective of guidance accuracy for achieving the prescribed drilling depths now undertaken accurately as to an engagement surface since loose chips are eliminated from the workpiece surface and with sharp tools no burrs arise on the workpiece surface, so that now the prescribed drilling depths are exactly achieved in spite of having unavoidable tolerances in the length of various tools, in the thickness and waviness of the printed circuit boards, and in the accuracy of the guidance between the workpeice holder and the respective operating unit, the effect of which is that the control mechanism separately recognizes for each operating unit, when, during each individual drilling operation, the tip of the tool has just contacted the actual workpiece surface of the printed circuit board and from this location of position the prescribed drilling depth is then achieved.

2. A machine according to claim 1, in which said reference measuring point essentially comprises a switch element that is disposed at a specific distance from an upper surface of said workpiece holder upon which said abutment surface of said operating unit rests during measurement, with said switch element being adapted to be actuated by said tip of said tool, and being electrically connected to said control mechanism.

3. A machine according to claim 1, which includes a device for holding down a workpiece, with said device being disposed on said operating unit, and being provided with said abutment surface that is adapted to rest upon a workpiece.

* * * * *